(12) United States Patent
Bando et al.

(10) Patent No.: US 7,709,854 B2
(45) Date of Patent: May 4, 2010

(54) LIGHT EMITTING DEVICE

(75) Inventors: Yoshitaka Bando, Tokushima (JP);
Shintaro Nakashima, Tokushima (JP);
Toshimasa Takao, Tokushima (JP)

(73) Assignee: Nichia Corporation, Anan-shi (JP)

( * ) Notice: Subject to any disclaimer, the term of this patent is extended or adjusted under 35 U.S.C. 154(b) by 82 days.

(21) Appl. No.: 11/867,240

(22) Filed: Oct. 4, 2007

(65) Prior Publication Data

US 2008/0083931 A1    Apr. 10, 2008

(30) Foreign Application Priority Data

Oct. 5, 2006   (JP) .............................. 2006-273615
Jul. 26, 2007  (JP) .............................. 2007-194018

(51) Int. Cl.
*H01L 33/00* (2006.01)

(52) U.S. Cl. .................... 257/99; 257/100; 257/106; 257/E33.058

(58) Field of Classification Search ............. 257/49–52, 257/E51.005, E29.151, 99, 100, 106, E33.058
See application file for complete search history.

(56) References Cited

U.S. PATENT DOCUMENTS 6,054,716 A * 4/2000 Sonobe et al. .............. 250/552

FOREIGN PATENT DOCUMENTS

| JP | H03-266459 A | 11/1991 |
| JP | H09-167848 A | 6/1997 |
| JP | H11-054804 A | 2/1999 |
| JP | 2002-314143 A | 10/2002 |

* cited by examiner

*Primary Examiner*—Thinh T Nguyen
(74) *Attorney, Agent, or Firm*—Global IP Counselors, LLP

(57) ABSTRACT

A light emitting device includes a package having a recess defined by an inner wall and a bottom surface and a lead terminal exposed at the bottom surface of the recess and protruded outward from the package. The lead terminal exposed at the bottom surface of the recess portion including a semiconductor light emitting element mounting region and a wire connecting region for connecting a conductive wire from the semiconductor light emitting element thereto. At least one of regions between the semiconductor light emitting element mounting region and the wire connecting region has a groove portion disposed in a position spaced apart from a peripheral edge portion of the lead terminal that is exposed at the bottom surface of the recess.

7 Claims, 5 Drawing Sheets

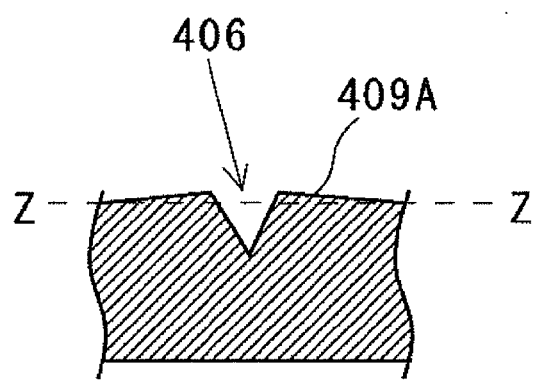
Fig.4A
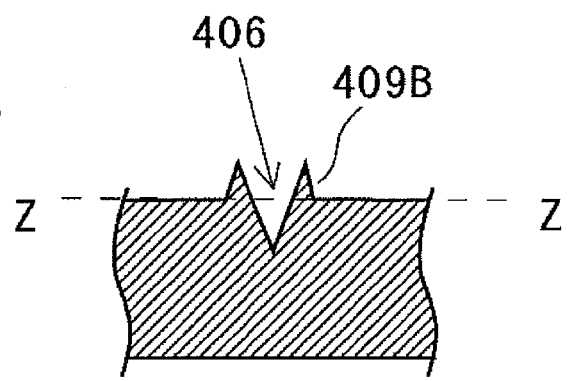
Fig.4B
Fig.5
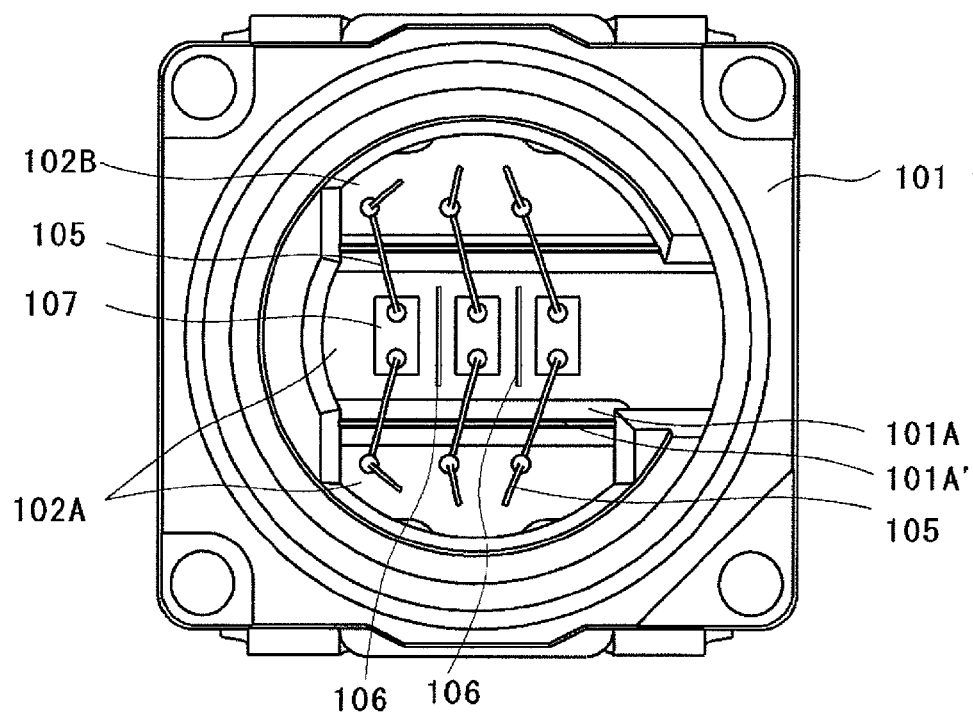

LIGHT EMITTING DEVICE

BACKGROUND OF THE INVENTION

1. Field of the Invention

The present invention relates to a light emitting device that can be used in an indicator, a lighting apparatus, a display, a backlight for liquid crystal display etc. More particularly, the present invention relates to a light emitting device that is highly reliable by employing a protective device even when a semiconductor light emitting element having high output is mounted thereon.

2. Background Information

For example, a chip type light-emitting element disclosed in Japanese Laid-Open Patent Application No. 11-54804 comprises an insulating substrate, a pair of terminal electrodes provided on both end parts of the surface of the substrate, a semiconductor light emitting element mounted on one of the terminal electrodes, and a protective element for protecting the semiconductor light emitting element from at least the reverse voltage that may be applied thereto. The protective element is mounted on the other one of the terminal electrodes. Each of the semiconductor light emitting element and the protective element is bonded respectively to an end portion side of the corresponding terminal electrode. A pair of wires for connecting the semiconductor light emitting element and the protective element with the opposite terminal electrodes is connected to pad portions formed integrally with the terminal electrodes.

By forming the terminal electrodes in such shape and by specifying the mounting locations of the semiconductor light emitting element and the protective element and the connecting locations of the wires, defective wire bonding can be prevented, and damages due to applied reverse voltage and high voltage caused by electrostatic charge can be prevented. Thus, a chip type light emitting element with improved reliability can be obtained.

However, when such a pad portion is provided at an end portion of a lead electrode constituting the terminal electrode, a distance between the mounting location of the semiconductor light emitting element or the protective element and the pad portion becomes too large. In other words, in the case in which a metal plate is subject to punching process by way of press working etc., a width approximately the same as the thickness of the plate is needed to form a through hole. Therefore, the distance between the mounting portion and the pad portion becomes larger as the thickness of the plate increases. In such cases, the package is required to be made larger to secure the mounting portions of the elements.

The smaller the thickness of the metal plate, the smaller the distance can be. However, in such cases, not only the strength of the metal plate, but also the strength of the package decreases. Further, the heat dissipation also decreases so that high output power cannot be achieved.

In addition, accuracy of processing a metal plate in a complicated shape, especially such a shape of the pad having a narrow width described in Japanese Laid-Open Patent Application No. 11-54804, is low, and processing of constant shape is difficult to obtain.

Moreover, when the distance between the end portion of the terminal and the lead portion is narrow, resin is difficult to be provided at the time of injection molding, which likely results in defective molding.

SUMMARY OF THE INVENTION

Accordingly, the present invention is devised to solve the above-described problems. One object of the present invention is to provide a light emitting device having a high reliability in which the lead terminal made of a planar metal is formed with a shape that is easy to process and unlikely causes defective molding at the time of processing so as to reduce defective mounting of a protective element etc. and defective bonding of the wires.

A light emitting device includes a package having a recess portion defined by an inner wall and a bottom surface and a lead terminal exposed at the bottom surface of the recess and protruded outward from the package.

According to one aspect of the present invention, the lead terminal exposed at the bottom surface of the recess includes a semiconductor light emitting element mounting region and a wire connecting region for connecting a conductive wire from the semiconductor light emitting element thereto. At least one of regions between the semiconductor light emitting element mounting region and the wire connecting region, and between the semiconductor light emitting element mounting regions has a groove portion disposed in a position spaced apart from a peripheral edge portion of the lead terminal that is exposed at the bottom surface of the recess.

According to another aspect of the present invention, the lead terminal exposed at the bottom surface of the recess includes a semiconductor light emitting device mounting region, a protective device mounting region, and a wire connecting region for connecting a conductive wire from a semiconductor light emitting element or from a protective element thereto. At least one of a region between the semiconductor light emitting element mounting region and the protective element mounting region, a region between the semiconductor light emitting element mounting region and the wire connecting region, a region between the protective element mounting region and the wire connecting region, and a region between the semiconductor light emitting element mounting regions has a groove portion disposed in a position spaced apart from a peripheral edge portion of the lead terminal that is exposed at the bottom surface of the recess.

With this configuration, an element mounting regions and a wire connecting region can be separated. Accordingly, a die bonding member can be prevented from flowing. Therefore, defective mounting and defective wire bonding can be prevented.

In the light emitting devices described above, a region disposed in an outer periphery of the groove portion is higher than a reference plane of the lead terminal.

Accordingly, a package resin can be prevented from flowing into the groove portion. Therefore, the defect can be prevented from occurring in the process.

According to the present invention, in a light emitting device comprising a semiconductor light emitting element and an optional protective element, defective mounting or defective wire bonding of the semiconductor light emitting element and the optional protective element can be prevented without forming a lead terminal in a complicated shape, and reliability of the light emitting device can be improved even at high power output operation.

BRIEF DESCRIPTION OF THE DRAWINGS

FIGS. 4A and 4B are cross sectional views illustrating shapes of groove portions.

FIG. 5 is a plan view illustrating another example of a light emitting device according to the present invention.

DETAILED DESCRIPTION OF THE PREFERABLE EMBODIMENTS

Figure 1A:
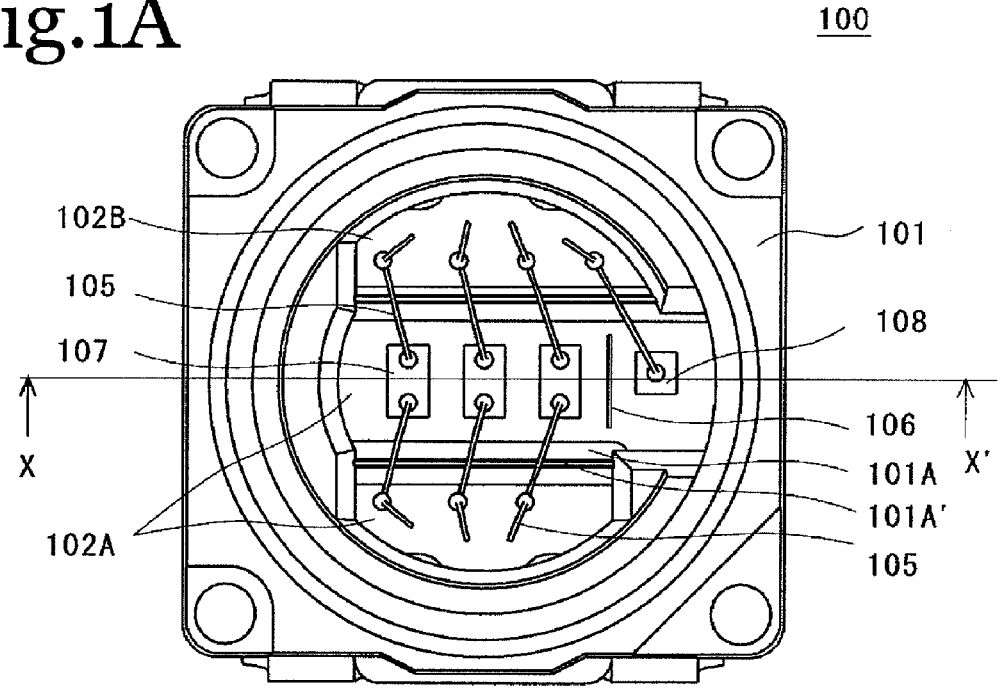
FIG. 1A is a plan view illustrating an example of a light emitting device according to the present invention.

The preferred embodiments of the present invention will be described below with reference to the accompanying drawings.

Herein, the form of the following embodiments are intended as examples of a light emitting device that are representative of the technology behind the present invention, and any limitation of the scope of the invention by the embodiments is not intended. In addition, the present specification will by no means limit the members described in claims to the members described in the embodiments. Especially, size, material, shape, and the relative configuration etc. of the components described in the preferred embodiments are for illustration purpose only, and do not intend to limit the invention therein, unless specifically described. In the drawings, the size and the positional relationship of the components may be exaggerated for clarity.

Further, in the description below, identical members or members of the same quality are assigned the same names and reference numerals and detailed description thereof will be arbitrarily omitted. In each constituting component of the present invention, multiple components may be constructed using the same member so that one member can serve as multiple components, or vice versa, a function of a member may be shared by multiple members.

FIG. 1 shows a light emitting device 100 according to the present embodiment.

Figure 1B:
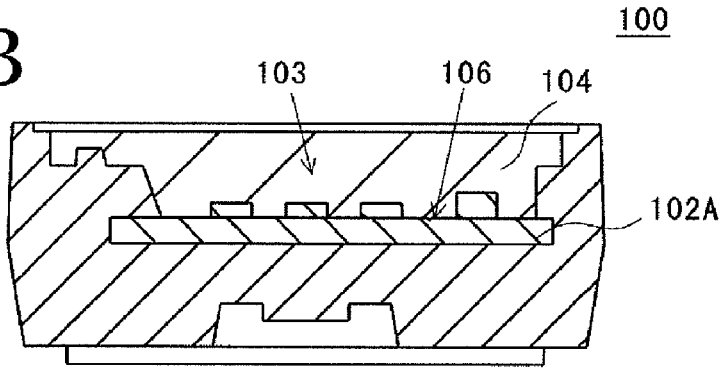
FIG. 1B is a sectional view taken along a section line X-X' of FIG. 1A.
Figure 1C:
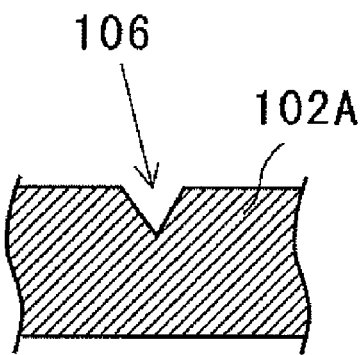
FIG. 1C is a partially enlarged view of FIG. 1B.

FIG. 1A is a plan view of the light emitting device, FIG. 1B is a cross-sectional view taken along a section line X-X' of FIG. 1A, and FIG. 1C is a partially enlarged view of FIG. 1B.

In the present embodiment, a package 101 of the light emitting device is made of a resin and includes a recess 103 with an upward opening defined by an annular side surface and a bottom surface.

As conductive members, lead terminals 102A and 102B are provided on the bottom surface of the recess 103 so as to be exposed within the recess 103. Further, a part of each of the lead terminals 102A and 102B extends outwardly so as to be enclosed in the package and to protrude from the side surface of the package 101. Accordingly, the lead terminals 102A and 102B function as conductive wiring for a semiconductor light emitting element 107 or the like mounted on the package 101.

The semiconductor light emitting element 107 and a protective element 108 are fixed on the lead terminals 102A and 102B by a die bonding member (not shown in the figure) such as a resin and a metal paste.

Then, the p-electrodes and n-electrodes of the semiconductor light emitting element 107 and the protective element 108 are electrically connected respectively with the lead terminals 102A and 102B by conductive wires 105 (hereinafter may be referred to as "wire").

Further, a sealing member 104 such as resin is disposed in the recess 103 so as to cover the components disposed within the recess 103.

In addition, as shown in FIG. 5, a light emitting device may comprise three semiconductor light emitting elements 107 without a protective element.

Moreover, in the present invention, a groove portion is provided in at least one of regions between the semiconductor light emitting element mounting region and the wire connecting region. More specifically, the groove portion may be provided between the semiconductor light emitting element mounting region and the protective element mounting region, between the protective element mounting region and the wire connecting region, and/or between the semiconductor light emitting mounting regions.

The groove portion is provided so as to be spaced apart from a peripheral edge portion of the lead terminal.

As used herein, "a mounting region of a semiconductor light emitting element" refers to a region on which a semiconductor light emitting element is mounted via a die bonding member, and indicates a region directly under and around the periphery of the semiconductor light emitting element.

Also, "a mounting region of a protective element" refers to a region on which a protective element is mounted via die bonding member, and indicates a region directly under and around the periphery of the protective element.

In addition, "a wire connecting region" refers to a region to which a wire and a lead terminal are connected.

Particularly, the groove portion is preferably formed between the semiconductor light emitting element mounting region and the wire connecting region or between the protective element mounting region and the wire connecting region. With such arrangement, short circuit between the wires and the lead terminals can be sufficiently prevented.

Groove

In the present invention, the groove portion is provided to the lead terminal in order to block or prevent the die bonding member, which connects a semiconductor light emitting element and a protective element to a lead electrode, from flowing. Therefore, negative effect on the connection of the semiconductor light emitting element and the protective element which are adjacently disposed to the groove portion can be prevented.

Figure 2:
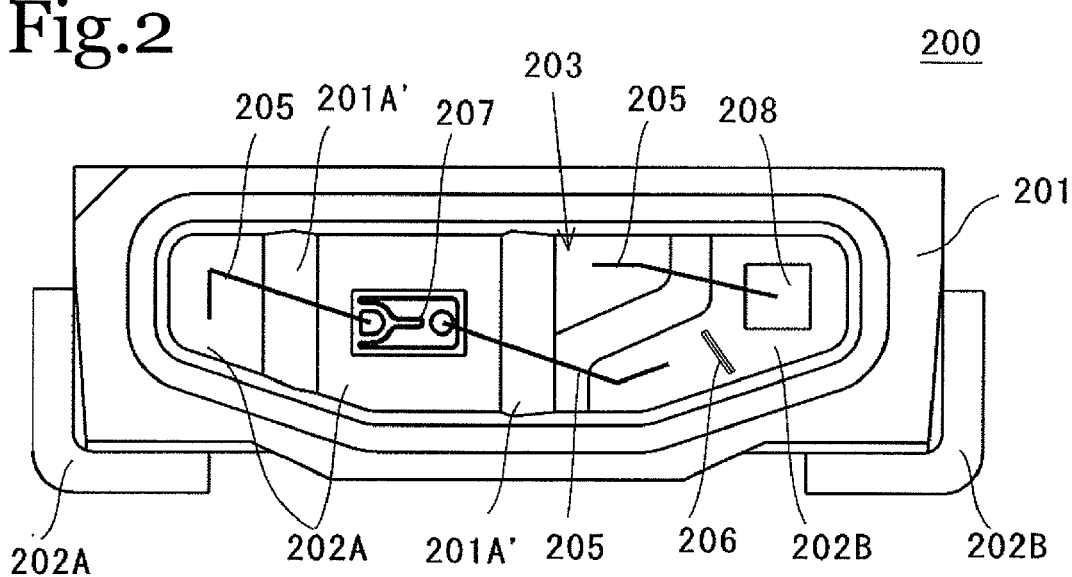
FIG. 2 is a plan view illustrating an example of a light emitting device according to the present invention.
Figure 3:
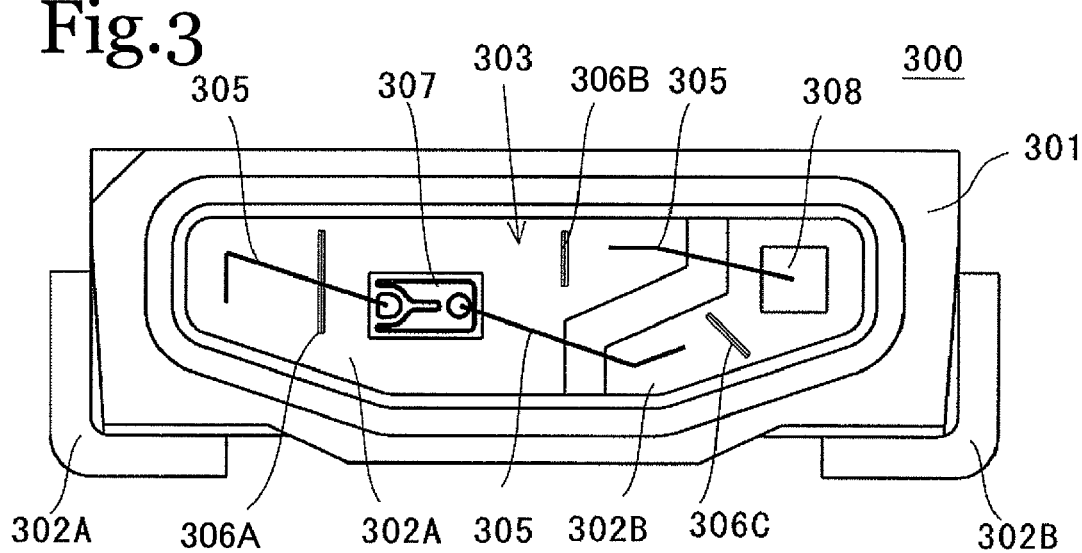
FIG. 3 is a plan view illustrating an example of a light emitting device according to the present invention.
Figure 6:
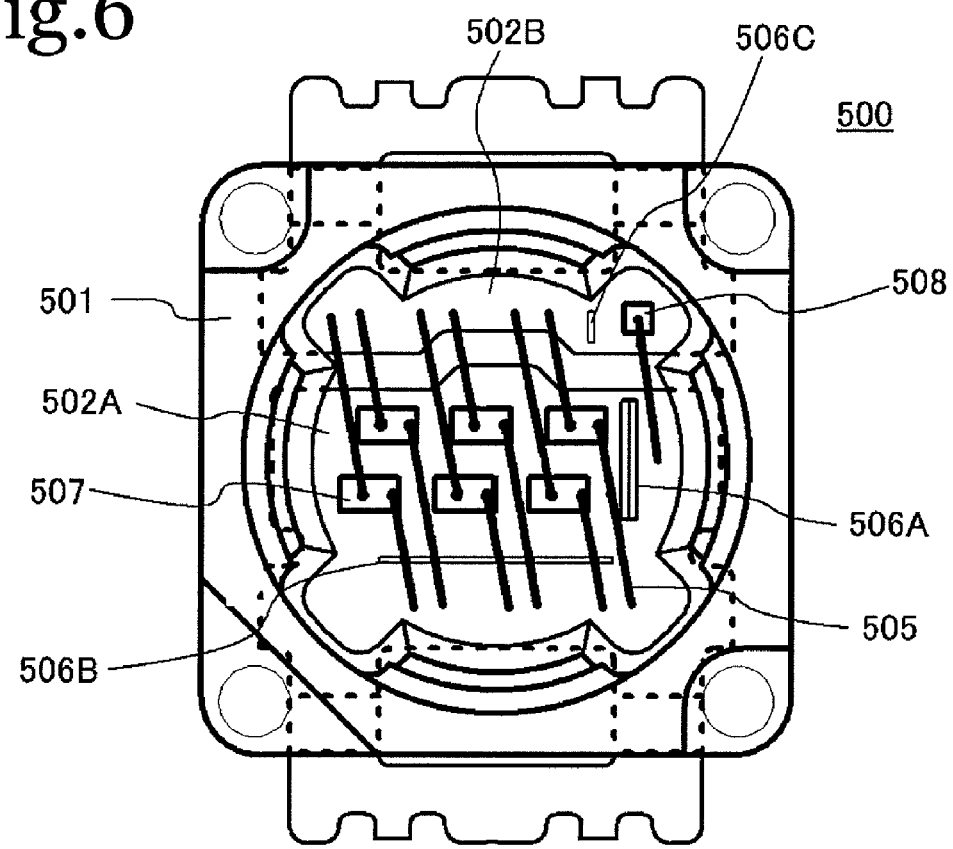
FIG. 6 is a plan view illustrating still another example of a light emitting device according to the present invention.
Figure 7:
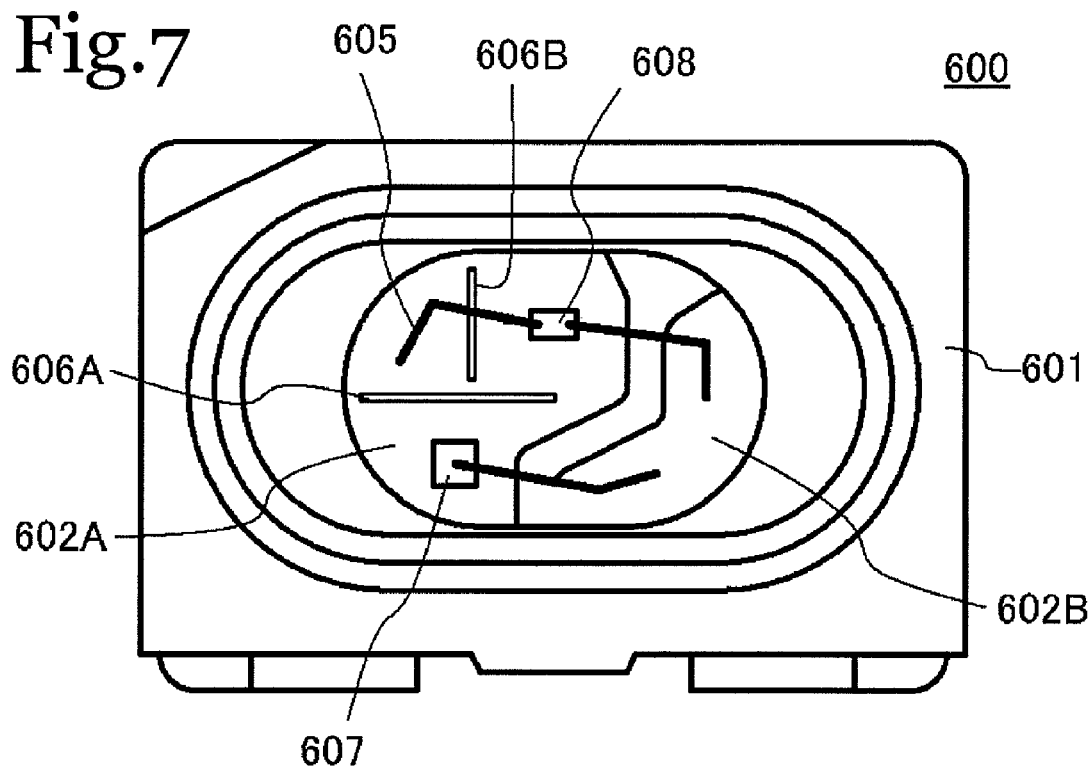
FIG. 7 is a plan view illustrating yet another example of a light emitting device according to the present invention.
Figure 8:
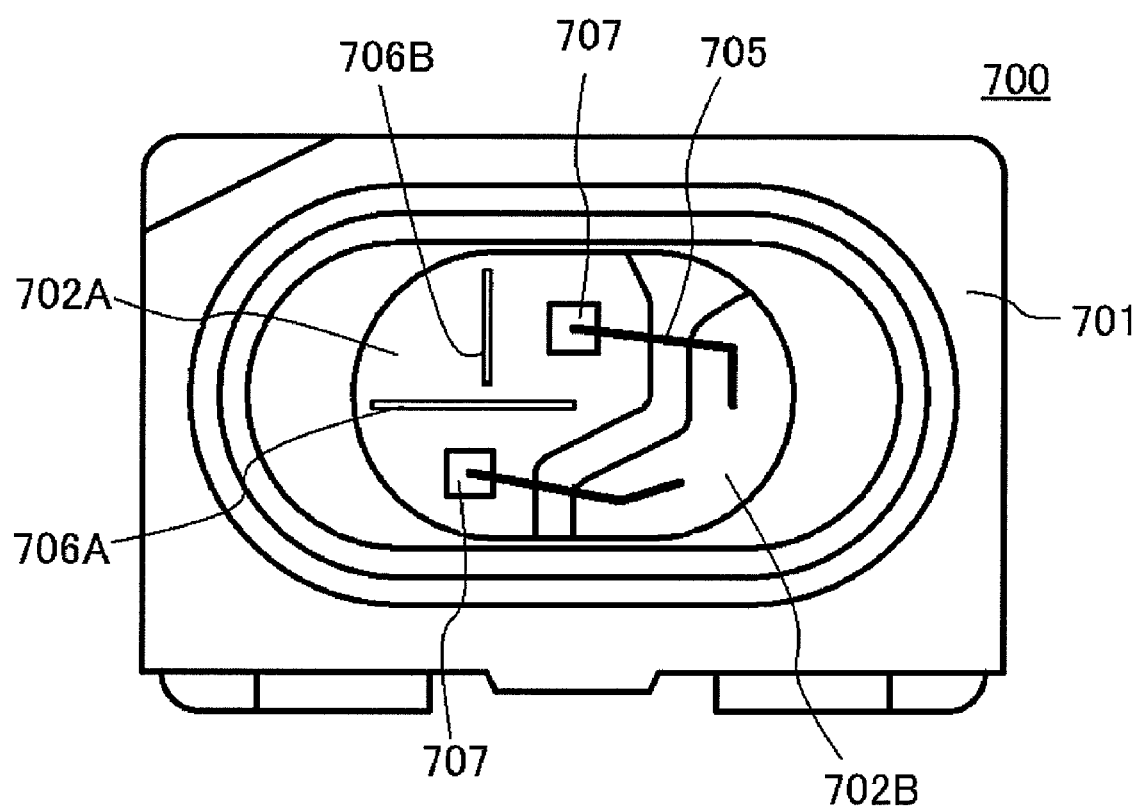
FIG. 8 is a plan view illustrating yet another example of a light emitting device according to the present invention.

Accordingly, examples of the locations for providing the groove portions 106, 206, 306A to 306C, 506A, 506B, 506C, 606A, 606B, 706A, and 706B are illustrated in FIGS. 1A, 2A, 3 and 5-8. As shown in FIG. A, the groove portion 106 is provided in a region between the semiconductor light emitting element 107 mounting region and the protective element 108 mounting region. As shown in FIG. 2A, the groove portion 206 is provided in a region between the protective element 208 mounting region and the connecting region of the wire 205 on the lead terminal 202B, which is connected to the semiconductor light emitting element 207. As shown in FIG. 3, the groove portion 306A is provided in a region between the semiconductor light emitting element 307 mounting region and the connecting region of the wire 305 on the lead terminal 302A, which is connected to the semiconductor light emitting element 307. The groove portion 306B is provided in a region between the semiconductor light emitting element 307 mounting region and the connecting region of the wire 305 on the lead terminal 302A, which is connected to the protective element 308. The groove portion 306C is provided in the similar position as the groove portion 206 of FIG. 2. As shown in FIG. 5, each of the groove portions 106 is provided in each of regions between the semiconductor light emitting element 107 mounting regions. As shown in FIG. 6, the groove portion 506A is provided in a region between the semiconductor light emitting element 507 mounting region and the connecting region of the wire 505 on the lead terminal 502A, which is connected to the protective element 508. The groove portion 506B is provided in a region between the semiconductor light emitting element 507 mounting region and the connecting region of the wire 505 on the lead terminal 502A, which is connected to the semiconductor light emitting element 507. As shown in FIG. 7, the groove portion 606A is provided in a region between the semiconductor light emitting element 607 mounting region and the connecting region of the wire 605 on the lead terminal 602A, which is connected to the semiconductor protective element 608. The groove portion 606B is provided in a region between the protective element 608 mounting region and the connecting region of the wire 605 on the lead terminal 602A which is connected to the protective element 608. As shown in FIG. 8, the groove portions 706A and 706B are provided in a region between the mounting regions of semiconductor light emitting elements 707.

When a groove portion is provided at the locations described above, the die bonding member can be prevented from flowing.

Moreover, by providing the groove portion, the flow of the die bonding member can be directed in a predetermined direction (along the groove) so that packaging accuracy and packaging density can be improved. Also, the length of the wire can be reduced. Accordingly, short circuit or the like can be reduced to a minimum and a high quality light emitting device can be obtained.

Further, by providing such a groove portion, excess amount of spreading of the die bonding member can be prevented effectively. Therefore, the amount of applying die bonding member can be increased to some extent so that the semiconductor light emitting element and optional protective element can be fixed to the lead terminals firmly.

In addition, the region of lead terminal which does not contribute to the connection can be covered to a maximum extent. Therefore, for example, even in the case where the lead terminal is made of silver and the like, reactivity such as oxidation and sulfuration can be prevented.

It is sufficient that the groove portion is provided to at least one of the locations described above. Alternatively, the groove portion may be provided to extend from the one of the locations described above.

For example, as shown in FIG. 3, the groove 306A is provided between the mounting region of the semiconductor light emitting element 307 and the connecting region of the conductive wire 305 so that the width of the groove 306A is approximately the same as and the length of the groove 306A is longer than that of other grooves 306B and 306C. Therefore, an end portion of the groove 306A extends over the region between the mounting region of the semiconductor light emitting element 307 and the connecting region of the wire 305. Because the groove portion 306A is provided widely (with extended length) as described above, even when a large amount of the die bonding member is used, the flow thereof can be blocked.

Further, in the present invention, in addition to providing the groove portion at the locations described above, the groove portion is required to be placed so as not to reach the peripheral edge portion of the lead terminal exposed at the bottom surface of the recess (i.e., the peripheral edge of the exposed region of the lead terminal). If the groove portion reaches the peripheral edge portion of the exposed lead terminal, the package resin tends to flow into the groove when forming the package by way of injection molding.

It would not be a problem if the resin flow into the groove portion stays within the groove after molding. However, in the cases where the depth of the groove is small or the width of the groove is narrow as in the present invention, the amount of resin flows into the groove portion is relatively small and the resin in the groove portion may cause insufficient adhesion between the lead terminal and the resin. In such case, separation of the lead terminal from the resin tends to occur. Thus, separation of resin that has flowed into the groove portion may cause defect in the manufacturing processes.

By providing the groove portion so as to be spaced apart from the peripheral edge portion of the exposed lead terminal as in the present invention, the package resin can be prevented from flowing into the groove during injection molding.

Further, providing the groove portion increases the contact area between the sealing resin filled in the recess and the lead terminal, so that adhesion can also be improved.

Such a groove portion can be formed when the lead terminal is processed into a predetermined shape from a plate metal. More specifically, a straight groove may be formed by, after performing punching process to obtain a predetermined shape, pressing (hitting) the surface of the plate metal, for example, with a working tool having a shape such as the tip of a flat-blade screwdriver.

With this arrangement, a groove portion that does not penetrate through the lead terminal can be formed, and therefore, a metal portion (lead terminal) can be provided under the groove portion so that heat dissipation can be improved.

Moreover, the groove portion can be formed so as to surround the periphery of the semiconductor light emitting element. Thus, packaging accuracy and packaging density can be improved and also the length of the wires can be reduced. Accordingly, short circuit or the like can be reduced to a minimum and a high quality light emitting device can be obtained.

Further, a groove portion can be provided by a simple processing even when a deformed material (a material such as a partially thick lead terminal which is exposed at the bottom surface to function as a heat sink as well) is used as a lead terminal. Therefore, decrease in heat dissipation can be avoided.

In this case, loading weight and the number of times of pressing and the like can be set appropriately, and the angle of the groove portion and the like can also be set appropriately.

In addition, the shape of the groove portion (a shape in planar view and a shape in the depth direction) and the depth thereof can be changed by changing the tip shape of the working tool.

In FIG. 1C, the cross section of the groove portion 106 is formed in a V-shape (triangular shape). However, the shape of the groove portion is not limited thereto and a polygonal shape such as square, rectangular, trapezoidal, and a shape having a curved side surface or bottom surface may also be formed.

In addition, when the groove portion is formed by pressing as described above, a region higher than the reference plane of the lead terminal can be formed in the periphery of the groove portion. This is because when a plate metal is pressed, the periphery of the pressed area rises. Therefore, a region higher than the reference plane of the lead terminal can be formed.

For example, when a fixing member for preventing a rise in the plate metal in the periphery of the pressed area is used, as shown in FIG. 4B, a protruded portion can be formed in the periphery of the groove portion 406 as a region 409B which is higher than the reference plane (line Z-Z). If the groove portion 406 is formed only by pressing without employing such a fixing member, as shown in FIG. 4A, the region 409A higher than the reference plane can be formed with a gradually rising shape.

As described above, by forming not only a groove portion but also a region higher than the reference plane, flowing of die bonding member can be further efficiently blocked.

The groove portion can also be formed by laser irradiation instead of pressing described above.

Alternatively, the groove can be formed by melting the plate metal by the heat of laser beam. At this time, molten metal flies to the periphery of the groove and thereby the region higher than the reference plane of the lead terminal is formed. With this, in a similar way as described above, flowing of die bonding member and wire bonding member can be blocked.

When a plurality of groove portions are provided as described later, especially when the groove portions with different directions are provided as shown in FIGS. 7 and 8, it is preferable to provide them so as not to cross each other. This is because if the groove portions with different directions are crossed, above-described rise may become excessive, and thereby a gap is created between the package and the mold during the formation of the package, and the package resin may flow into the gap. Therefore, regions higher than the reference plane are preferably provided so as not to cross each other, in view of the depth of the grooves and the distance between the groove portions.

As described above, the region formed periphery of the groove portion and higher than the reference plane of the lead terminal may be removed afterwards so as to be coplanar to the reference plane.

Further, as a forming method of the groove portion, other than that described above, etching or cutting can be employed.

Planar shape of the groove portion is not specifically limited to any specific shape. More specifically, a straight shape shown in FIG. 1A, a curved shape, or the like can be employed as the planar shape of the groove portion although a straight shape is preferable. Also, the width and the depth of the groove portion are not specifically limited to any specific arrangement and can be set appropriately in compliance with the accuracy and ease of the processing.

Moreover, the light emitting device can be provided with one groove portion or a plurality of groove portions. When the plurality of groove portions are provided, for example, as shown in FIG. 3, the groove portions 306A, 306B are provided to the lead terminal 302A and the groove portion 306C is provided to the lead terminal 302B. Thus, the groove portions may be provided separately to both lead terminals, or otherwise, a plurality of groove portions may be provided to the same lead terminal. Also, when the plurality of groove portions are provided, the groove portions may be formed with the same shape and size, or otherwise, may be formed with different shapes and sizes.

Lead Terminal

The shape of the lead terminal is not specifically limited to any specific shape. It is sufficient that the lead terminal can be electrically connected to a semiconductor light emitting element and also that a part of the lead terminal is enclosed in the base member and another part thereof is provided outwardly from the base member, so as to have a function of establishing electric connection to external portion with the extended portion.

In addition, the lead terminal exposed at the bottom surface of the recess may have a through hole.

For example, in FIG. 1A, an exposed portion 101A made of the same resin as the package 101 is formed in the lead terminal 102A, and the exposed portion 101A is an opening portion of the lead terminal 102A formed by filling a resin in the opening at the time of injection molding.

The lead terminal 102A is separated by the exposed portion 101A at the bottom surface of the recess 103, but contiguous within the package.

As in this case, when a wider area is provided between the mounting region of the semiconductor light emitting element 107 and the connecting region of the wire 105 on the lead terminal, which is connected to the semiconductor light emitting element 107, the die bonding member can be blocked from flowing by providing a through hole (the exposed portion 101A), not by providing a groove portion.

In addition, a protrusion 101A' may further be provided to the exposed portion 101A. Accordingly, flowing of the die bonding member can be blocked more sufficiently.

The protrusion 101A' may be smaller than the width of the exposed portion 101A of the package as shown in FIG. 1A, or the entire exposed portion may be made into a protrusion 201A' as shown in FIG. 2.

The material for the lead terminal preferably has relatively large thermal conductivity. When the lead terminal is made of such material, heat generated in the semiconductor light emitting element can be released efficiently. For example, a material with thermal conductivity of approximately 200 W/(m·K) or higher is preferable.

Moreover, it is preferable to use a material having relatively large mechanical strength, or a material on which punching process or etching process can be easily performed. Specific examples thereof include metals such as copper, aluminum, gold, silver, tungsten, iron, and nickel, or iron-nickel alloy, phosphorus bronze, copper containing iron, or the like.

Package

A package protects electric components such as the semiconductor light emitting element and the protective element. Also, the package includes a conductive member for supplying external electric current to such electric components.

Although the shape of the package is preferably rectangular or a shape close to a rectangular in plane view, it is not specifically limited thereto, and a triangular, a square, a polygonal or a shape close thereto in plane view can be employed.

In addition, the package includes a recess capable of mounting the semiconductor light emitting element and the protective element therein. The recess is defined by a side surface and a bottom surface. A lead terminal is exposed at the bottom surface and the semiconductor light emitting element mounting region, the protective element mounting region, and the wire connecting region are provided on the exposed lead terminal.

According to the location of the recess, a light emitting device which emits light from the upper surface thereof as shown in FIG. 1A or light emitting devices which emit light from a side surface thereof as shown in FIGS. 2 and 3, can be made.

The shape of the recess can be selected as appropriate, and the shapes of the bottom surface and side surface of the recess can also be appropriately selected.

As the resin for the package, an insulating member is preferable, and further, the member which does not easily transmit light from the light emitting element and external light is preferable.

Also, a thermosetting resin, a thermoplastic resin or the like, a resin having a certain degree of strength can be used. Specific examples thereof include a phenol resin, a glass epoxy resin, a BT resin, and a PPA resin.

Sealing Member

A sealing member is a member for protecting the semiconductor light emitting element and the protective element, which are mounted on the package having a recess, from dust, moisture, external force or the like. The sealing member preferably has light transmitting property that is capable of transmitting light from the semiconductor light emitting element.

Specific examples thereof include a silicone resin, an epoxy resin, and a urea resin.

In addition to above-described materials, a coloring agent, a light diffusing agent, a filler, a color conversion member (fluorescent member) or the like, may be included as desired.

The filling amount of the sealing member is required to be sufficient to cover the semiconductor light emitting element, the protective element such as Zener diode, and a conductive wire, or the like.

Die Bonding Member

Die bonding member is a bonding member for mounting a semiconductor light emitting element, the protective element or the like, on a base substrate or a conductive member. According to the substrate on which the element is mounted, either a conductive die bonding member or an insulating die bonding member can be selected.

For example, for a semiconductor light emitting element in which nitride semiconductor layers are stacked on a sapphire substrate which is an insulating substrate, a die bonding member of either insulating or conductive can be used. When a conductive substrate such as SiC substrate is used, conduction can be established by using a conductive die bonding member.

Examples of the insulating die bonding member include an epoxy resin and a silicone resin.

When the above described resins are used, a metal layer having high reflectivity such as an Al layer may be provided on the back surface of the semiconductor light emitting element, in consideration of deterioration due to light and heat from the semiconductor light emitting element.

In this instance, a method such as vacuum evaporation, sputtering, or thin layer bonding can be employed.

Examples of conductive die bonding members include a conductive paste comprising silver, gold, or palladium, a solder such as Au—Sn eutectic, and a brazing filler metal such as a low melting temperature metal.

Moreover, among such die bonding members, especially when a transparent die bonding member is used, a fluorescent member which absorbs light from the semiconductor light emitting element and emits light in different wavelength may be included.

Conductive Wire

The conductive wire connecting the electrode of the semiconductor light emitting element and the conductive member provided on the package is required to provide good ohmic contact, mechanical connection, electric conduction property, and thermal conduction property to the conductive members.

For the thermal conductivity, 0.01 cal/(s)(cm$^2$)(°C./cm,) or greater is preferable, and 0.5 cal/(s)(cm$^2$)(°C./cm) or greater is more preferable.

In addition, it is preferable that the diameter of the conductive wires be greater than or equal to $\Phi$10 μm and less than or equal to $\Phi$45 μm in view of efficiency.

The conductive wire can be a wire made of a metal such as gold, copper, platinum, and aluminum, or the like, or an alloy using these metals.

Wavelength Converting Member

In the above described transparent member, a fluorescent member which absorbs at least part of light from the semiconductor light emitting element and emits light in different wavelength may be included as a wavelength converting member.

It is more efficient when a fluorescent member converts light from the semiconductor light emitting element to a light with longer wavelength.

The fluorescent member may comprise a single layer made of a fluorescent material etc., may comprise a single layer made of mixture of two or more fluorescent materials etc., may comprise two or more stacked layers of single layers each of which made of a fluorescent material etc., or may comprise two or more stacked layers of single layers each of which is made of a mixture of two or more fluorescent materials etc.

The fluorescent member is required to be sufficient to, for example, absorb light from a semiconductor light emitting element comprising a nitride semiconductor as a light emitting layer and to convert it to light of a different wavelength.

The fluorescent material is preferably at least one selected from among nitride fluorescent materials and acid nitride fluorescent material that is mainly activated with lanthanoid elements such as Eu and Ce; alkaline earth halogen apatitie fluorescent material that is mainly activated with lanthanoid elements such as Eu and transition metal elements such as Mn; alkaline earth metal halogen-borate fluorescent material; alkaline earth metal aluminate fluorescent material; rare earth element aluminate fluorescent material that is mainly activated with alkaline earth silicate, alkaline earth sulfide, alkaline earth thiogallate, alkaline earth silicon nitride, germanate, or lanthanoid elements such as Ce; and organic and organic complexes that are mainly activated with rare earth silicate or lanthanoid elements such as Eu.

For example, the fluorescent materials described below can be used but it is not limited thereto. Examples of the nitride fluorescent material that is mainly activated with lanthanoid elements such as Eu and Ce include $M_2Si_5N_8$:Eu (M represents at least one element selected from among Sr, Ca, Ba, Mg and Zn). In addition to $M_2Si_5N_8$:Eu, the above examples also include $MSi_7N_{10}$:Eu, $M_{1.8}Si_5O_{0.2}N_8$:Eu and $M_{0.9}Si_7O_{0.1}N_{10}$:Eu (wherein M represents at least one element selected from among Sr, Ca, Ba, Mg and Zn).

Also, a nitride fluorescent material, which is activated with lanthanoid elements such as Eu and includes Group II elements M, Si, Al and N, absorbs ultraviolet to blue light and emits light in a range from yellow-red to red. This nitride fluorescent material is represented by general formula $M_wAl_xSi_yN_{((2/3)w+x+(4/3)y)}$:Eu and further includes at least one element selected from rare earth elements, tetravalent elements, and trivalent elements as an additive element. M represents at least one selected from the group consisting of Mg, Ca, Sr, and Ba. In the above general formula, the range of w, x, y are preferably $0.04 \leq w \leq 9$, $x=1$, and $0.056 \leq y \leq 18$. The range of w, x, y may be $0.04 \leq w \leq 3$, $x=1$, $0.143 \leq y \leq 8.7$, and more preferably $0.05 \leq w \leq 3$, $x=1$, $0.167 \leq Y \leq 8.7$. The nitride fluorescent material may also be represented by the general formula $M_wAl_xSi_yB_zN_{((2/3)w+x+(4/3)y+z)}$:Eu in which boron B is additionally included. Also in the above formula, M is at least one selected from the group consisting of Mg, Ca, Sr, and Ba, wherein $0.04 \leq w \leq 9$, $x=1$, $0.056 \leq y \leq 18$, and $0.0005 \leq z \leq 0.5$. When boron is included, the molar concentration thereof is adjusted to 0.5 or less, as described above, preferably 0.3 or less, more preferably greater than 0.0005. Further preferably, the molar concentration of boron is adjusted to 0.001 or more and 0.2 or less.

The above described nitride fluorescent materials further include at least one selected from the group consisting of La, Ce, Pr, Gd, Tb, Dy, Ho, Er, and Lu, or one of Sc, Y, Ga, and In or one of Ge and Zr.

By including the above elements, luminance, quantum efficiency or peak intensity which is equal or greater than that with Gd, Nd, Tm can be outputted.

Example of the oxynitride phosphor that is mainly activated with lanthanoid elements such as Eu and Ce includes $MSi_2O_2N_2$:Eu (wherein M represents at least one element selected from among Sr, Ca, Ba, Mg and Zn).

Example of the alkaline earth halogen apatite phosphor that is mainly activated with lanthanoid elements such as Eu, or with transition metal elements such as Mn includes $M_5(PO_4)_3X$:R (wherein M represents at least one element selected from among Sr, Ca, Ba, Mg and Zn, X represents at least one element selected from among F, Cl, Br, and I, and R represents either Eu or Mn, or both).

Example of the alkaline earth metal borate halogen phosphor includes $M_2B_5O_9X$:R (wherein M represents at least one element selected from among Sr, Ca, Ba, Mg and Zn. X represents at least one element selected from among F, Cl, Br, and I, and R represents either Eu or Mn, or both).

Example of the alkaline earth metal aluminate phosphor includes $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (wherein R represents at least one selected from Eu and Mn, or both).

Example of the alkaline earth silicate fluorescent material includes $(Sr_{1-a-b-x}Ba_aCa_bEu_x)_2SiO_4$ ($0 \leq a \leq 1$, $0 \leq b \leq 1$, and $0.005 \leq x \leq 0.1$).

Example of the alkaline earth sulfide fluorescent material include $La_2O_2S$:Eu, $Y_2O_2S$:Eu and $Gd_2O_2S$:Eu.

Example of the rare earth aluminate fluorescent material that is mainly activated with lanthanoid elements such as Ce include YAG fluorescent materials represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y,Gd)_3(Al,Ga)_5O_{12}$. It also includes $Tb_3Al_5O_{12}$:Ce and $Lu_3Al_5O_{12}$:Ce in which portion or all of Y is substituted with Th or Lu.

Example of the other fluorescent material include ZnS:Eu, $Zn_2GeO_4$:Mn and $MGa_2S_4$:Eu (wherein M represents at least one element selected from among Sr, Ca, Ba, Mg and Zn).

If needed, at least one element selected from among Tb, Cu, Ag, Au, Cr, Nd, Dy, Co, Ni and Ti, in place of Eu, or in addition to Eu may be contained in the fluorescent materials described above.

The Ca—Al—Si—O—N oxynitride glass fluorescent material is a fluorescent material composed mainly of an oxynitride glass comprising 20 to 50 mol % of $CaCO_3$ based on CaO, 0 to 30 mol % of $Al_2O_3$, 25 to 60 mol % of $SiO$, 5 to 50 mol % of AlN, 0.1 to 20 mol % of rare earth oxide or transition metal oxide, the total content of five components being 100 mol %.

In the fluorescent material composed mainly of the oxynitride glass, the nitrogen content is preferably 15% by weight or less, and the fluorescent glass preferably contains, in addition to rare earth element ions, 0.1 to 10 mol % of other rare earth element ions in the form of rare earth oxide as a coactivator.

It is possible to use a fluorescent material which is other than the fluorescent materials described above and has substantially the same performances and effects as those of the fluorescent materials described above.

Semiconductor Light Emitting Element

In the present invention, a laser diode is preferably used as a semiconductor light emitting element. Accordingly, light can be introduced to the light guiding member efficiently.

A semiconductor light emitting element having any output wavelength can be selected.

For constructing blue and green light emitting elements, ZnSe and nitride semiconductor ($In_XAl_YGa_{1-X-Y}N$, $0 \leq X$, $0 \leq Y$, $X+Y \leq 1$) may be used. For constructing red light emitting elements, GaAs, InP, and the like may be used.

Further, a semiconductor light emitting element made of materials other than those described above may also be used.

Composition, emitting color, size, and number of the light emitting elements can be selected appropriately according to purpose.

In the case where a light emitting device includes a fluorescent material, a nitride semiconductor ($In_XAl_YGa_{1-X-Y}N$, $0 \leq X$, $0 \leq Y$, $X+Y \leq 1$) capable of emitting light with a short-wavelength which sufficiently excites the fluorescent material is preferable.

Various wavelengths of emission can be selected according to the materials and the mixed crystal ratio of the semiconductor layer.

In addition, a light emitting element capable of emitting light which is not only in visible light range but also ultraviolet light and infrared light can be formed.

Further, along with a semiconductor light emitting element, an optical detector element or the like can be mounted.

According to the light emitting device of the present invention, a light emitting device capable of high power output can be made by mounting a protective element, so that it is applicable to various indicators, a lighting apparatus, a display, a backlight of liquid crystal display, and further to an image scanner device for a facsimile, a copier, a scanner etc., and a projector or the like.

What is claimed is:

1. A light emitting device comprising:
   a package having a recess defined by an inner wall and a bottom surface; and
   a lead terminal exposed at the bottom surface of the recess and protruded outward from the package,
   the lead terminal exposed at the bottom surface of the recess portion including a semiconductor light emitting element mounting region and a wire connecting region for connecting a conductive wire from a semiconductor light emitting element thereto, wherein at least one region of a region within the light emitting element mounting region and a region between the semiconductor light emitting element mounting region and the wire connecting region has a groove portion formed on a top surface in a position spaced apart from a peripheral edge portion of the lead terminal that is exposed at the bottom surface of the recess, and the groove portion of the lead terminal does not penetrate through the lead terminal.

2. The semiconductor light emitting device according to claim 1, wherein a region disposed in an outer periphery of the groove portion is higher than a reference plane of the lead terminal on which the semiconductor light emitting element is disposed.

3. The semiconductor light emitting device according to claim 1, wherein the semiconductor light emitting element mounting region includes a pair of semiconductor light emitting elements mounted thereon, and the groove portion is disposed between the semiconductor light emitting elements within the semiconductor light emitting device mounting region.

4. The semiconductor light emitting device according to claim 1, wherein the lead terminal exposed at the bottom surface of the recess further includes a protective element mounting region.

5. The semiconductor light emitting device according to claim 4, wherein a region between the semiconductor light emitting element mounting region and the protective element mounting region has an additional groove portion disposed in a position spaced apart from the peripheral edge portion of the lead terminal that is exposed at the bottom surface of the recess.

6. The semiconductor light emitting device according to claim 4, wherein a region between the protective element mounting region and the wire connecting region has an additional groove portion disposed in a position spaced apart from the peripheral edge portion of the lead terminal that is exposed at the bottom surface of the recess.

7. The semiconductor light emitting device according to claim 1, wherein the groove portion of the lead terminal has a generally V-shape cross section.

* * * * *